(12) United States Patent
Basceri et al.

(10) Patent No.: US 7,482,239 B2
(45) Date of Patent: *Jan. 27, 2009

(54) METHODS OF FORMING INTEGRATED CIRCUITRY

(75) Inventors: Cem Basceri, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/515,432

(22) Filed: Aug. 31, 2006

(65) Prior Publication Data

US 2006/0292814 A1    Dec. 28, 2006

Related U.S. Application Data

(63) Continuation of application No. 10/649,311, filed on Aug. 25, 2003, now Pat. No. 7,101,767.

(51) Int. Cl.
   *H01L 21/20* (2006.01)
(52) U.S. Cl. .................. 438/381; 438/386; 438/387; 438/396; 438/397; 438/398; 257/E21.019; 257/E21.396
(58) Field of Classification Search .......... 257/E21.019, 257/E21.396
   See application file for complete search history.

(56) References Cited

U.S. PATENT DOCUMENTS

| 5,534,458 | A |  | 7/1996 | Okudaira et al. |
| 5,716,891 | A |  | 2/1998 | Kodama |
| 5,789,291 | A | * | 8/1998 | Sung ..................... 438/254 |
| 5,909,617 | A |  | 6/1999 | Manning et al. |
| 6,001,686 | A |  | 12/1999 | Ding |
| 6,214,714 | B1 |  | 4/2001 | Wang et al. |
| 6,274,457 | B1 | * | 8/2001 | Sakai et al. ............. 438/424 |
| 6,274,483 | B1 | * | 8/2001 | Chang et al. ............ 438/640 |
| 6,281,073 | B1 |  | 8/2001 | Lee |
| 6,458,653 | B1 |  | 10/2002 | Jang |
| 6,555,429 | B2 |  | 4/2003 | Matsui et al. |
| 6,559,499 | B1 | * | 5/2003 | Alers et al. ............. 257/311 |

(Continued)

OTHER PUBLICATIONS

Wolf et al. Silicon Processing for the VLSI Era, vol. 1—Process Technology, Second Edition, 2000, Lattice Press, pp. 657-658.

*Primary Examiner*—Walter L Lindsay, Jr.
*Assistant Examiner*—Mohsen Ahmadi
(74) *Attorney, Agent, or Firm*—Wells St. John P.S.

(57) ABSTRACT

In one implementation, an opening within a capacitor electrode forming layer is formed over a substrate. A spacing layer is deposited over the capacitor electrode forming layer to within the opening over at least upper portions of sidewalls of the opening. The spacing layer is formed to be laterally thicker at an elevationally outer portion within the opening as compared to an elevationally inner portion within the opening. A spacer is formed within the opening by anisotropically etching the spacing layer. The spacer is laterally thicker at an elevationally outer portion within the opening as compared to an elevationally inner portion within the opening. After forming a first capacitor electrode layer laterally over the spacer, at least a portion of the spacer is removed and a capacitor dielectric region and a second capacitor electrode layer are formed over the first capacitor electrode layer.

32 Claims, 6 Drawing Sheets

U.S. PATENT DOCUMENTS

| | | |
|---|---|---|
| 6,599,574 B1 | 7/2003 | Yieh et al. |
| 6,667,209 B2 | 12/2003 | Won et al. |
| 6,670,238 B2 | 12/2003 | Deboer |
| 6,686,235 B2 | 2/2004 | Clampitt |
| 6,686,237 B1 | 2/2004 | Wofford et al. |
| 6,806,135 B2 | 10/2004 | Lim et al. |
| 7,101,767 B2 * | 9/2006 | Basceri et al. ............ 438/386 |
| 2002/0064934 A1 | 5/2002 | Deboer et al. |
| 2003/0001268 A1 | 1/2003 | Oh |

* cited by examiner

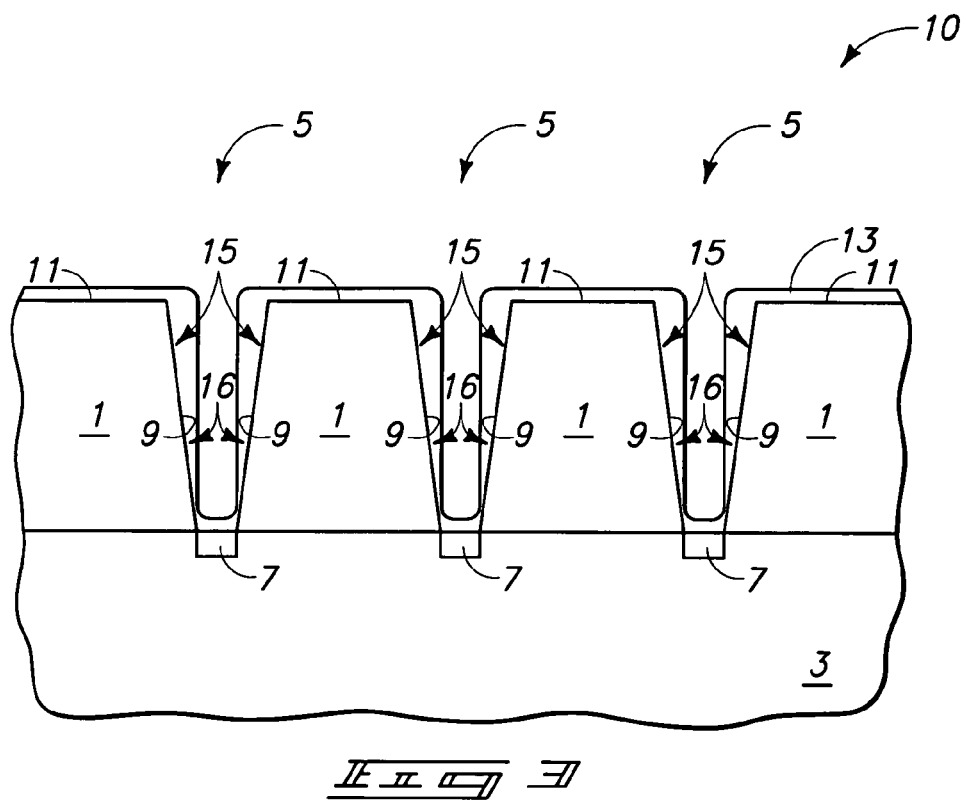
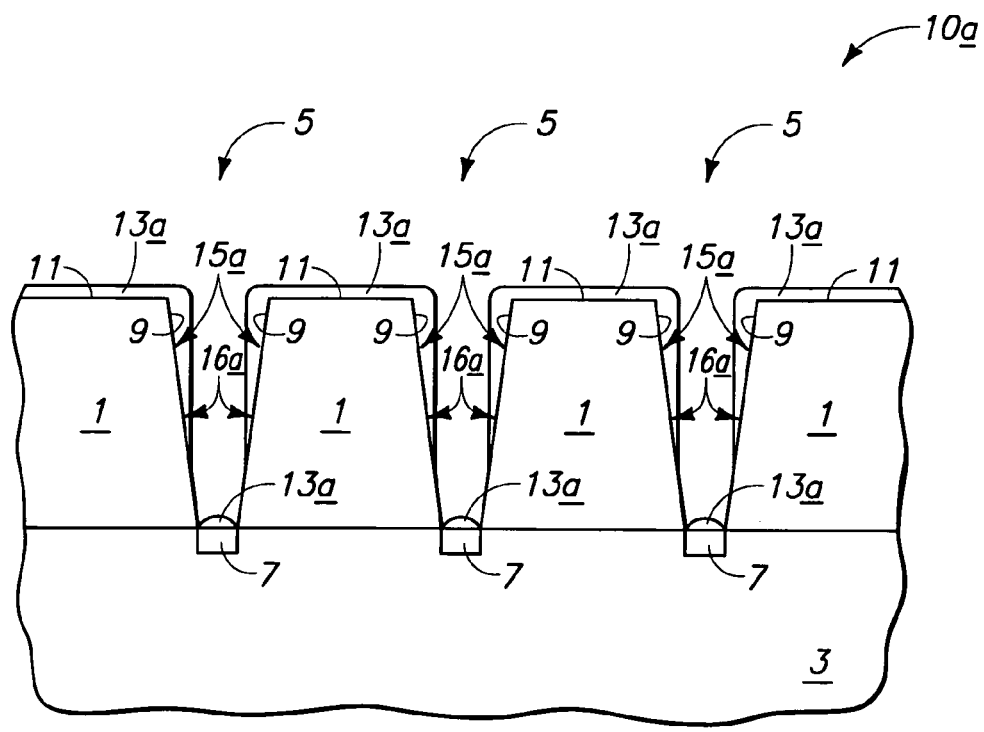

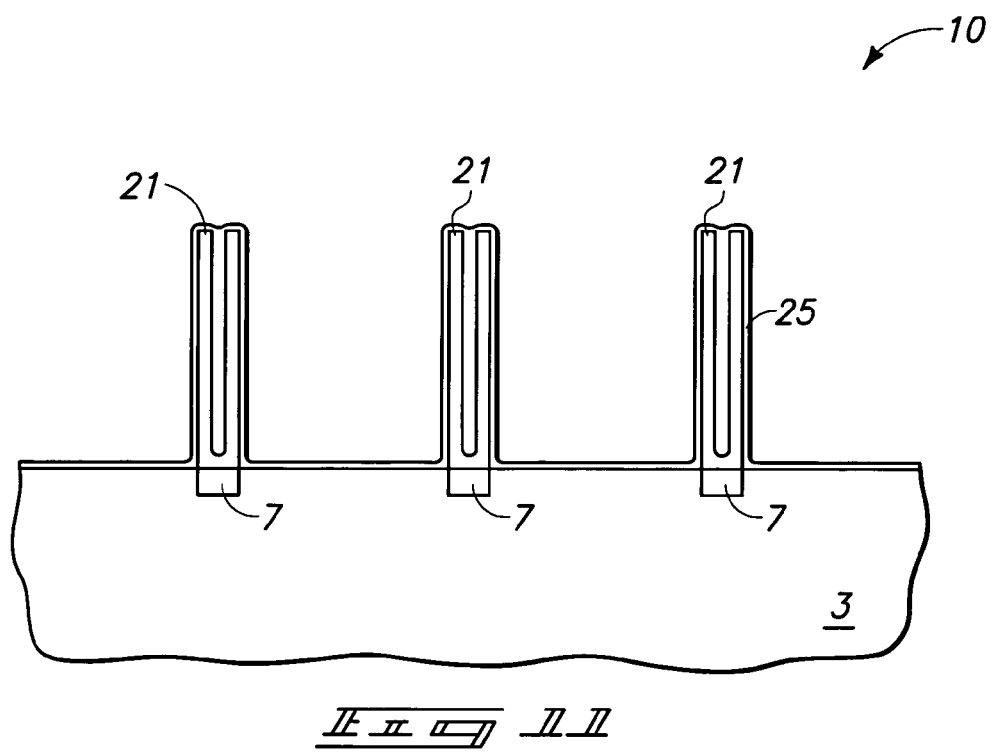
_FIG. 11_
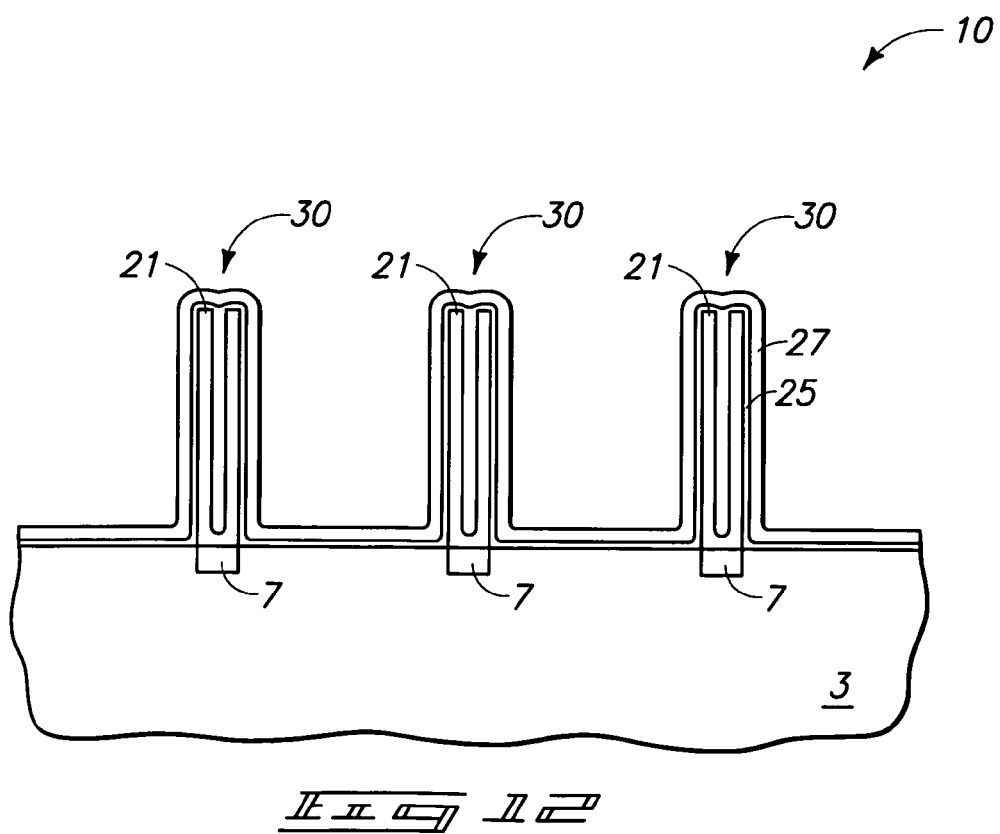
_FIG. 12_

US 7,482,239 B2

METHODS OF FORMING INTEGRATED CIRCUITRY

CROSS REFERENCE TO RELATED APPLICATION

This patent is a continuation of U.S. patent application Ser. No. 10/649,311, filed Aug. 25, 2003, now U.S. Pat. No. 7,101,767 B2, entitled "Methods of Forming Capacitors", the entirety of which is incorporated by reference.

TECHNICAL FIELD

This invention relates to methods of forming capacitors.

BACKGROUND OF THE INVENTION

A continuing goal of semiconductor processing is increased miniaturization while maintaining high performance. Miniaturization has caused aspect ratios of capacitor structures and memory arrays to increase. Capacitor structures might be 15,000 to 20,000 Å tall and only 1000 Å across. These high aspect ratios present challenges when forming capacitors. One particular challenge concerns supporting capacitor electrodes upright while the capacitors are being fabricated.

While the invention was motivated by addressing the above issues and challenges, it is, of course, no way so limited. The invention is only limited by the accompanying claims as literally worded and appropriately interpreted in accordance with the doctrine of equivalents.

SUMMARY OF THE INVENTION

This invention includes methods of forming capacitors. In one implementation, a method of forming a capacitor sequentially includes forming an inwardly-tapered-sidewall spacer within an opening of a capacitor electrode forming layer. A first capacitor electrode layer is deposited over the inwardly-tapered-sidewall spacer within the opening. A capacitor dielectric region is formed and then a second capacitor electrode layer is formed over the first capacitor electrode layer.

In one implementation, a method of forming a capacitor includes providing a substrate having a capacitor electrode forming layer thereon. The capacitor electrode forming layer has an opening. A sidewall spacer is formed within the opening. The sidewall spacer is laterally thicker at an elevationally outer portion within the opening as compared to an elevationally inner portion within the opening. A first capacitor electrode layer is formed within the opening laterally over the sidewall spacer. At least a portion of the sidewall spacer is removed. A capacitor dielectric region and a second capacitor electrode layer are formed over the first capacitor electrode layer.

In one implementation, a method of forming a capacitor includes forming an opening within a capacitor electrode forming layer over a substrate. The opening has sidewalls and the sidewalls have upper portions. A spacing layer is deposited over the capacitor electrode forming layer to within the opening over at least the upper portions of the sidewalls. The spacing layer is formed to be laterally thicker at an elevationally outer portion within the opening as compared to an elevationally inner portion within the opening. A spacer is formed within the opening by anisotropically etching the spacing layer. The spacer is laterally thicker at an elevationally outer portion within the opening as compared to an elevationally inner portion within the opening. A first capacitor electrode layer is formed laterally over the spacer within the opening. After forming the first capacitor electrode layer, at least a portion of the spacer is removed and a capacitor dielectric region and a second capacitor electrode layer are formed over the first capacitor electrode layer.

Other aspects and implementations are contemplated.

BRIEF DESCRIPTION OF THE DRAWINGS

Preferred embodiments of the invention are described below with reference to the following accompanying drawings.

FIG. 3 is a view of the FIG. 2 substrate fragment shown at a processing stage subsequent to that of FIG. 2.

FIG. 4 is a view of an alternate embodiment substrate fragment to that shown by FIG. 3.

FIG. 11 is a view of the FIG. 10 substrate fragment shown at a processing stage subsequent to that of FIG. 10.

FIG. 12 is a view of the FIG. 11 substrate fragment shown at a processing stage subsequent to that of FIG. 11.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
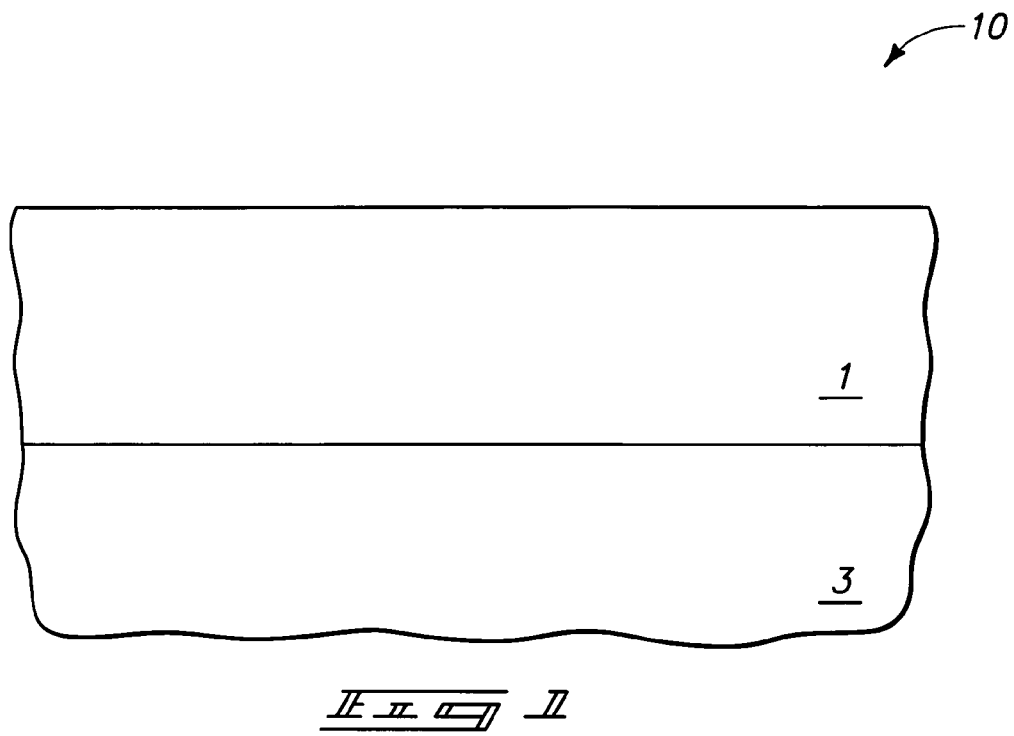
FIG. 1 is a diagrammatic cross-sectional view of a substrate fragment in process in accordance with an aspect of the invention.

Exemplary capacitor forming methods in accordance with some aspects of the present invention, are described with reference to FIGS. 1-12. Referring to FIG. 1, a substrate 10 comprises a base semiconductive substrate 3, for example bulk monocrystalline silicon, having a capacitor electrode forming layer 1 there over. An exemplary material for layer 1 is borophosphosilicate glass (BPSG). To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Further the term "layer" includes both the singular and the plural, unless otherwise indicated.

Figure 2:
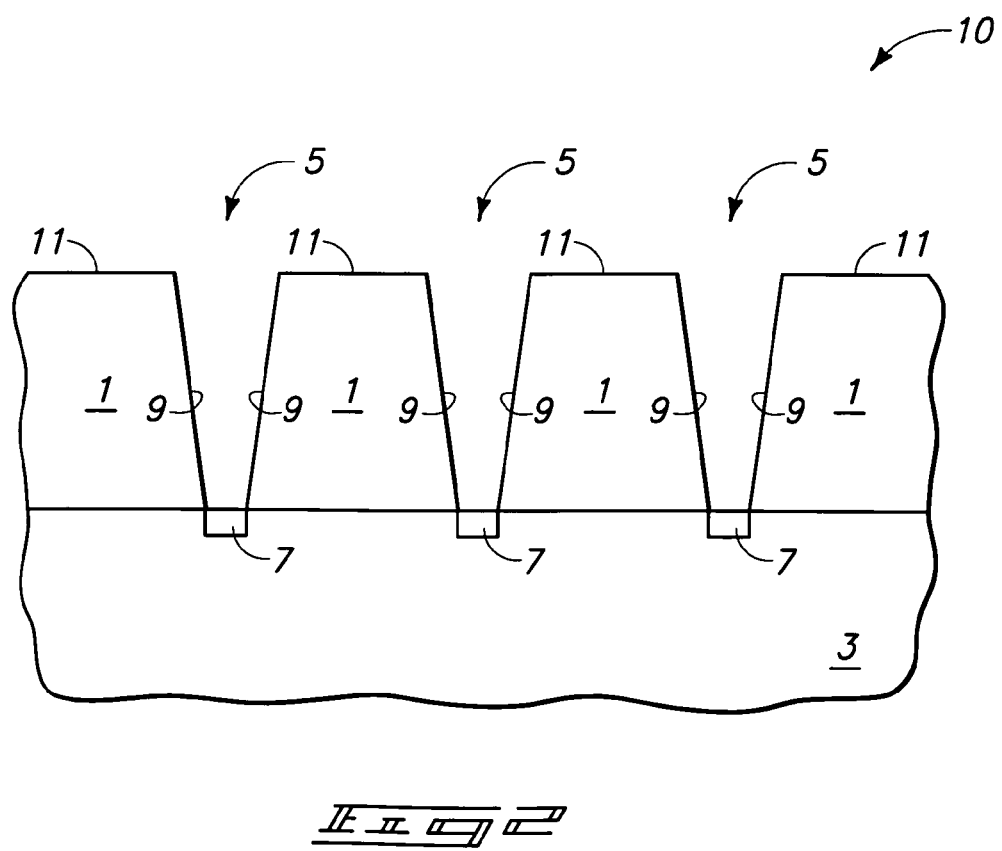
FIG. 2 is a view of the FIG. 1 substrate fragment at a processing stage subsequent to that of FIG. 1.

Referring to FIG. 2, openings 5 have been formed in capacitor electrode forming layer 1, for example by etching. Capacitor electrode forming layer 1 can be considered as having an elevationally outermost surface 11 proximate openings 5. Openings 5 include sidewalls 9. In the illustrated embodiment, sidewalls 9 include at least some straight linear portion which is angled from normal to elevationally outermost surface 11. In one implementation, the straight linear portions are angled at least 5 degrees from normal to elevationally outermost surface 11; in another, at least 10 degrees; and in another, at least 15 degrees. Exemplary diffusion regions 7 have been formed within substrate 3 for electrical connection with the capacitor being formed, as will be apparent from the continuing discussion.

Referring to FIG. 3, a spacing layer 13 has been deposited over capacitor electrode forming layer 1 within openings 5 over at least upper portions of sidewalls 9. Exemplary spacing layer 13 materials are TiN and polysilicon. Spacing layer 13 can be considered as having elevationally outer portions 15 within openings 5 and elevationally inner portions 16 within openings 5. Spacing layer 3 has been formed to be laterally thicker at elevationally outer portions 15 as compared to elevationally inner portions 16. Spacing layer 13 may also be deposited over only portions of sidewalls 9 or over an entirety of sidewalls 9 as shown in FIG. 3.

For example, any one or more of pressure, temperature, precursor flow rate, and other parameters might be modified in a particular CVD process to achieve laterally thicker outer portions as compared to inner portions within openings. For example, providing a deposition pressure of at least 10 Torr, for example from 10 Torr to 20 Torr, and even greater than 20 Torr, can provide the laterally thicker outer portion effect in some CVD processes. Such can also be facilitated in some CVD processes by increasing temperature to from 600° C. to 700° C., or higher.

In one exemplary implementation for a TiN comprising spacing layer, $TiCl_4$ and $NH_3$ can be flowed to substrate 10 simultaneously at a volumetric ratio of $TiCl_4$ to $NH_3$ of less than 4:1, for example from about 1:1 to about 3:1, with closer to 1:1 being more preferred. Preferred pressures are from 10 Torr to about 20 Torr, or higher, with preferred temperature being from about 600° C. to about 700° C., or higher. Spacing layer 13 may also be deposited over only portions of sidewalls 9, or over an entirety of sidewalls 9 as shown in FIG. 3.

Referring to FIG. 4, an alternate embodiment substrate 10a to substrate 10 depicted by FIG. 3 is shown. Like numerals to those of the first described embodiment are utilized where appropriate, with differences being indicated with the suffix "a". Spacing layer 13a has been deposited over only portions of sidewalls 9. Depending upon aspect ratio, CVD, or other processing parameters, deposition might appear more like FIG. 3 or more like FIG. 4. Higher aspect ratios may tend more toward the FIG. 4 deposition. Material of layer 13/13a may or may not form over substrate material at the back of the openings.

Figure 5:
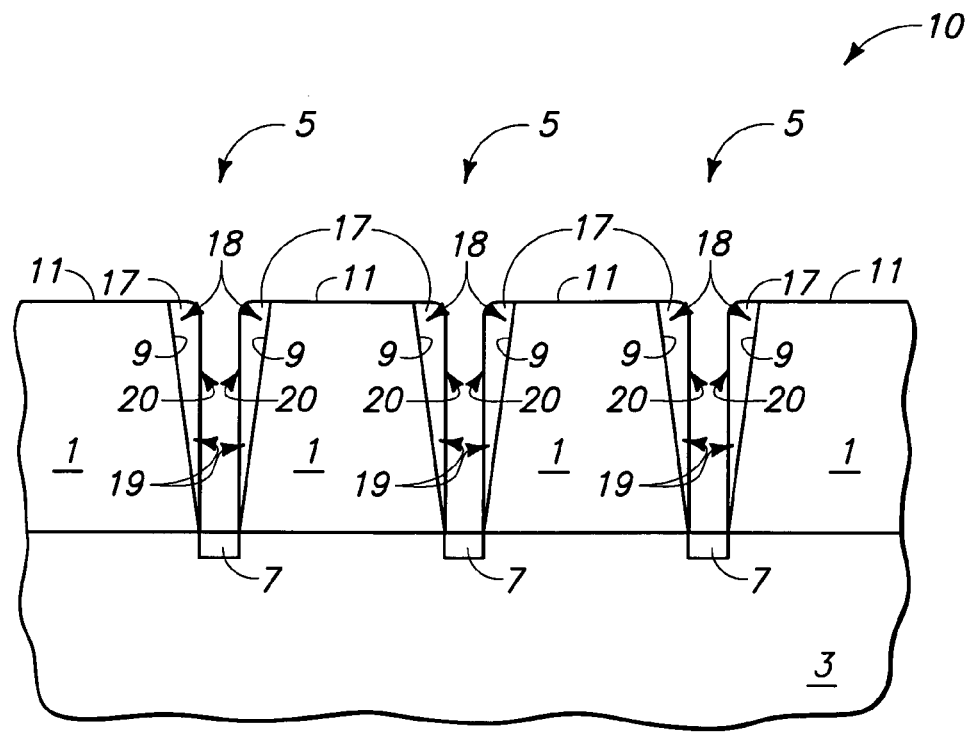
FIG. 5 is a view of the FIG. 3 substrate fragment shown at a processing stage subsequent to that of FIG. 3.

Referring to FIG. 5, spacers 17 have been formed within openings 5 at a processing stage subsequent to that depicted in FIG. 3. Spacers 17 include sidewalls 20. In the illustrated and preferred embodiment, sidewalls 20 include at least some straight linear portion which is angled normal to outermost surface 11. Spacers 17 can be considered as having elevationally outer portions 18 within openings 5 and elevationally inner portions 19 within openings 5. Spacers 17 are laterally thicker at elevationally outer portions 18 as compared to elevationally inner portions 19. In one exemplary implementation, spacers 17 are formed by anisotropically etching spacing layer 13. Spacers 17 might be formed over only portions of sidewalls 9, or over an entirety of sidewalls 9 as shown in FIG. 5.

Figure 6:
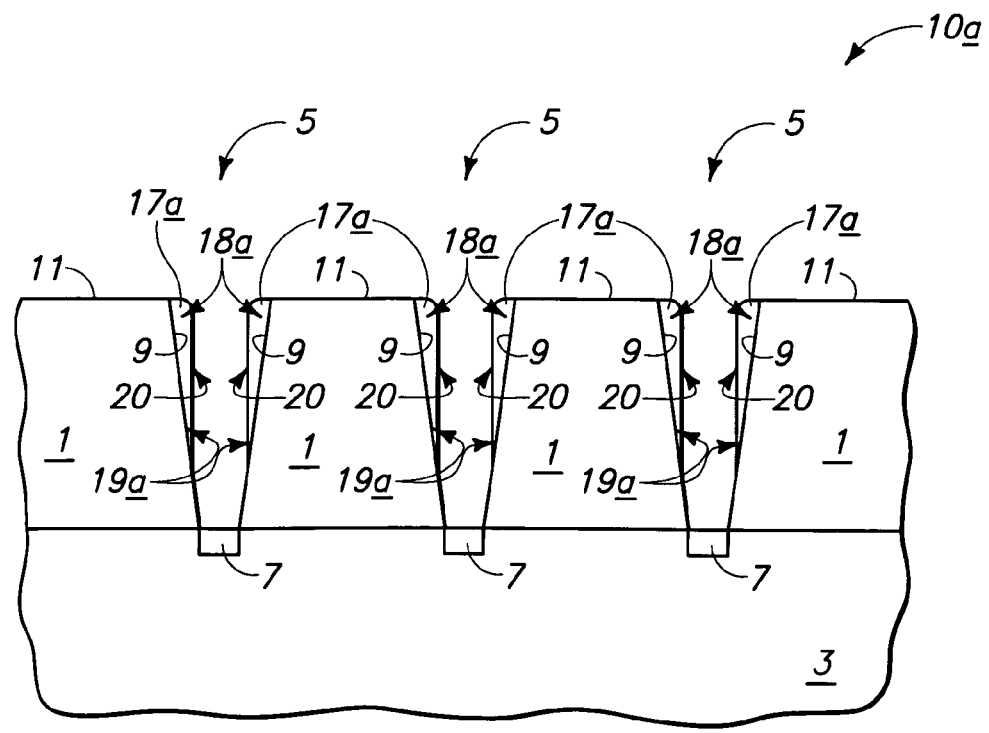
FIG. 6 is a view of an alternate embodiment substrate fragment to that shown by FIG. 5.

Referring to FIG. 6, substrate 10a of FIG. 4 has been processed to form spacers 17a, for example by anisotropic etching. Spacers 17a have been formed over only portions of sidewalls 9.

The above described embodiments are only exemplary of techniques that may be utilized to form inwardly-tapered-sidewall spacers, for example using deposition and anisotropic etch. Any other known or yet-to-be developed techniques might also be utilized. For example, and by way of example only, spacers might be grown in a manner that forms laterally thicker spacers at outer portions of openings as compared to inner portions of openings.

Figure 7:
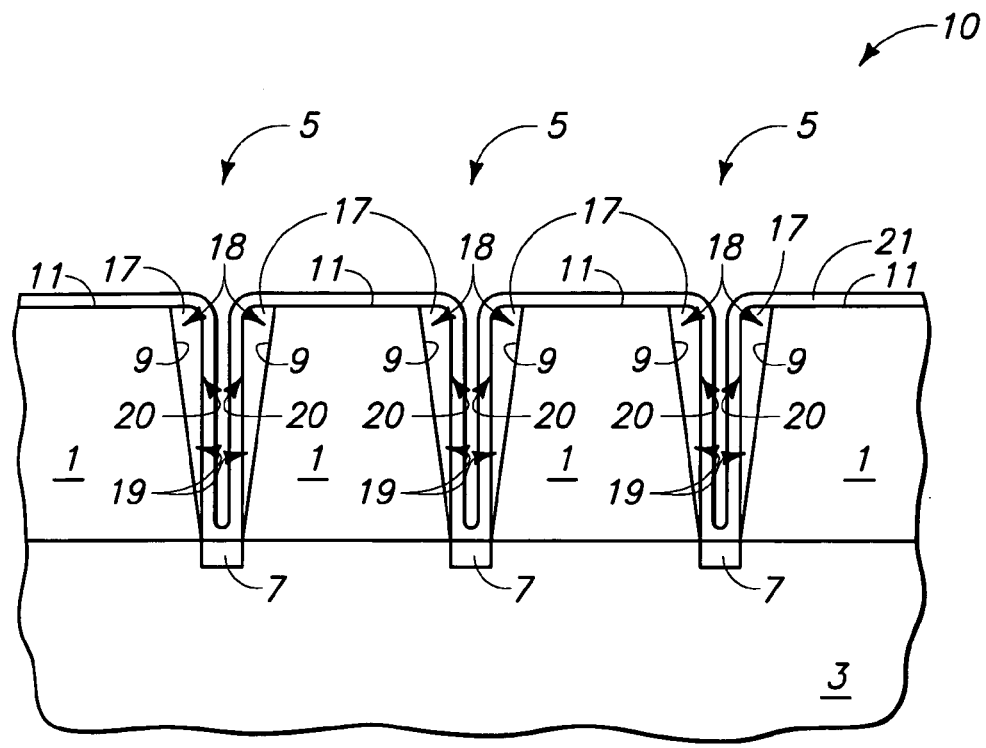
FIG. 7 is a view of the FIG. 5 substrate fragment shown at a processing stage subsequent to that of FIG. 5.

Referring to FIG. 7, a capacitor electrode layer 21 is formed over spacers 17, for example laterally there over as shown. Exemplary capacitor electrode layer 21 materials are TiN and polysilicon. In one exemplary implementation, spacers 17 can comprise TiN and capacitor electrode layer 21 can comprise polysilicon. In another exemplary implementation, capacitor electrode layer 21 can comprise TiN and spacers 17 can comprise polysilicon. Other materials and combinations are, of course, contemplated. Capacitor electrode layer 21 can be formed by any existing or yet-to-be developed technique, with chemical vapor deposition being but one example.

Figure 8:
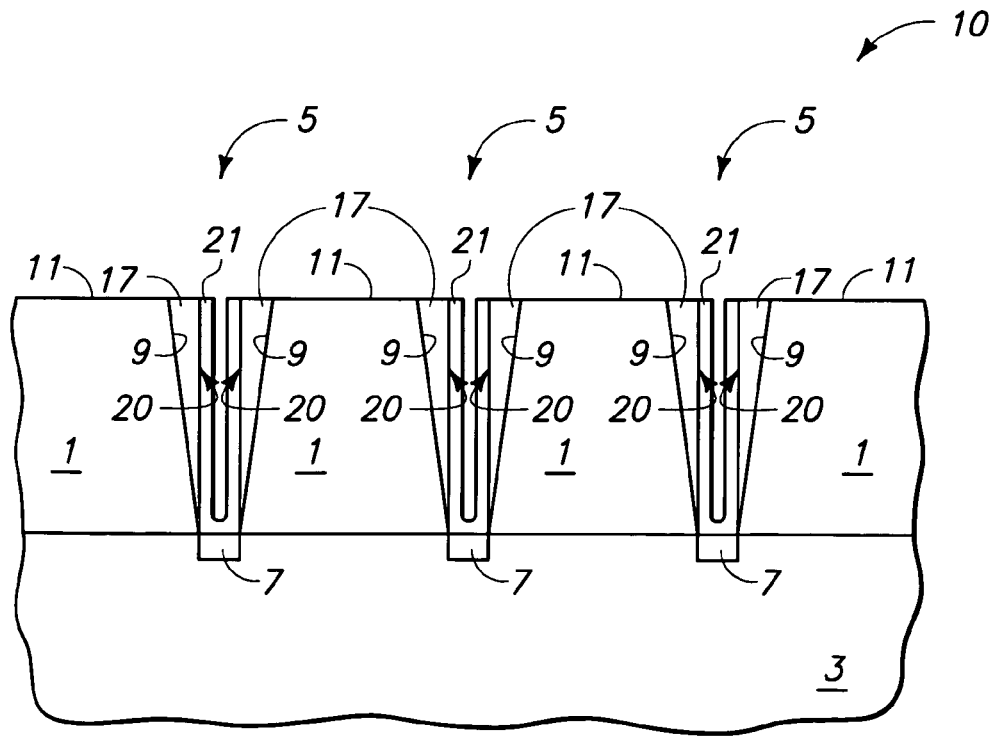
FIG. 8 is a view of the FIG. 7 substrate fragment shown at a processing stage subsequent to that of FIG. 7.

Referring next to FIG. 8, capacitor electrode layer 21 has been removed elevationally outward of capacitor electrode forming layer 1 and spacers 17. An exemplary technique is chemical mechanical polishing (CMP), although any existing or yet-to-be developed technique is contemplated. Such provides but one example of forming a capacitor electrode.

Figure 9:
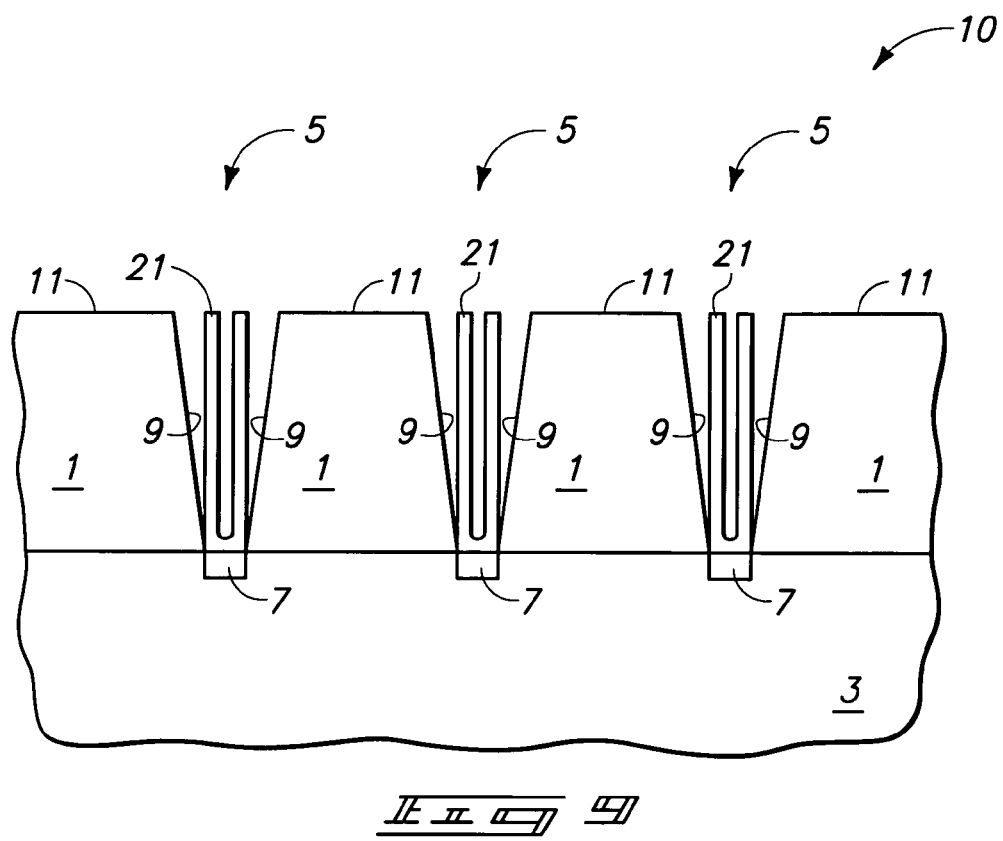
FIG. 9 is a view of the FIG. 8 substrate fragment shown at a processing stage subsequent to that of FIG. 8.

Referring to FIG. 9, at least portions of spacers 17 have been removed. An exemplary method of removing a TiN spacer material includes exposure to a mixture comprising $H_2SO_4$ and $H_2O_2$. In one exemplary implementation, the $H_2SO_4$ and $H_2O_2$ mixture has a weight ratio of $H_2SO_4$ to $H_2O_2$ of about 2:1. An exemplary method of removing a polysilicon spacer includes exposure to tetramethylammonium hydroxide. (TMAH). At least a portion, a majority, or substantially all of spacers 17 may be removed. Alternately, but less preferred, a substantial entirety of the spacer might remain.

Figure 10:
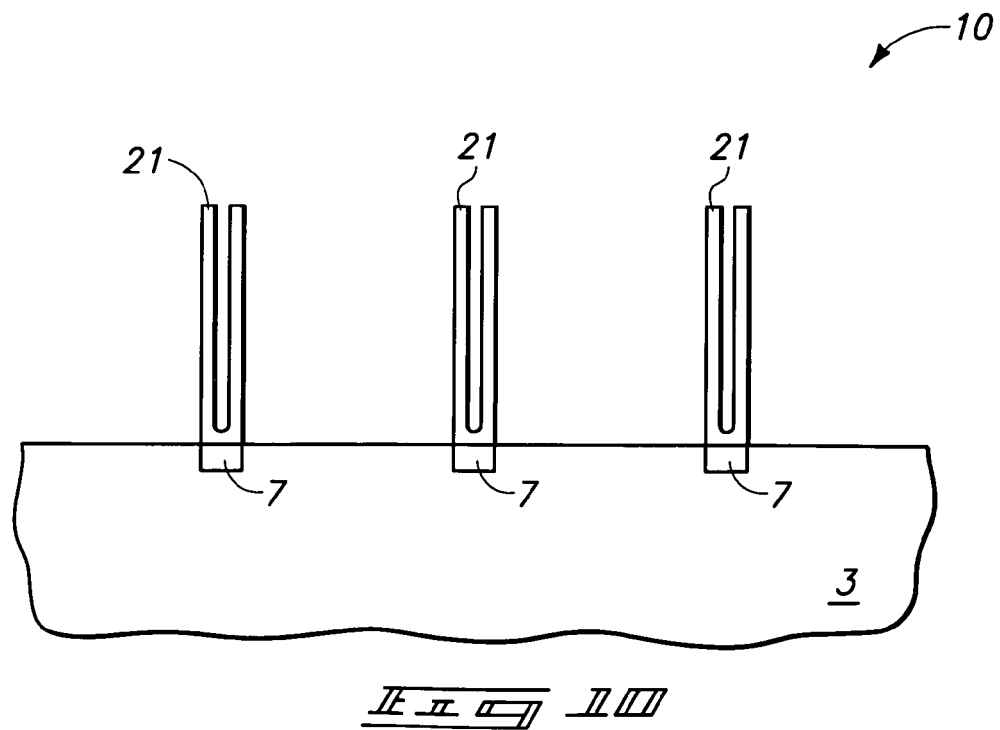
FIG. 10 is a view of the FIG. 9 substrate fragment shown at a processing stage subsequent to that of FIG. 9.

Referring to FIG. 10, capacitor electrode forming layer 1 has been removed. Capacitor electrode forming layer 1 may be removed by known or yet-to-be developed techniques, with selective etching being but one example.

Referring to FIG. 11, a capacitor dielectric region 25 has been formed over the capacitor electrode layer 21. Exemplary dielectric region material includes silicon dioxide, silicon nitride and any high k dielectric material or materials whether existing or yet-to-be developed. Referring to FIG. 12, a capacitor electrode layer 27 has been formed over dielectric region 25, thus forming an exemplary formation of capacitors 30. Dielectric region 25 and capacitor electrode layer 27 can be deposited by any existing or yet-to-be developed technique, with chemical vapor deposition being but one example.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming integrated circuitry, sequentially comprising:
   forming an inwardly-tapered-sidewall spacer within an opening of a substrate wherein the inwardly-tapered-sidewall spacer comprises one or both of TiN and polysilicon; and
   depositing a first layer over the inwardly-tapered-sidewall spacer within the opening, the first layer comprising a portion of an integrated circuit.

2. The method of claim 1 wherein the inwardly-tapered-sidewall spacer comprises TiN.

3. The method of claim 2 wherein the substrate comprises polysilicon.

4. The method of claim 2 further comprising removing at least a portion of the inwardly-tapered-sidewall spacer after the depositing, the removing comprising exposing the inwardly-tapered-sidewall spacer to a mixture comprising $H_2SO_4$ and $H_2O_2$, the mixture having a weight ratio of $H_2SO_4$ to $H_2O_2$, of about 2:1.

5. The method of claim 1 wherein the inwardly-tapered-sidewall spacer comprises polysilicon.

6. The method of claim 5 wherein the first layer comprises TiN.

7. The method of claim 6 further comprising, after depositing the first layer, removing at least a portion of the inwardly-tapered-sidewall spacer, the removing comprising exposing the inwardly-tapered-sidewall spacer to TMAH.

8. The method of claim 1 wherein the opening comprises sidewalls and the inwardly-tapered-sidewall spacer resides over at least upper portions of the sidewalls.

9. The method of claim 1 wherein the opening comprises sidewalls and the inwardly-tapered-sidewall spacer resides over an entirety of the sidewalls.

10. The method of claim 1 further comprising removing at least a portion of the inwardly-tapered-sidewall spacer after the depositing the first layer.

11. A method of forming integrated circuitry, sequentially comprising:
    forming an inwardly-tapered-sidewall spacer within an opening of a substrate, wherein the opening comprises sidewalls and the inwardly-tapered-sidewall spacer resides over less than an entirety of the sidewalls; and
    depositing a first layer over the inwardly-tapered-sidewall spacer within the opening, the first layer comprising a portion of an integrated circuit.

12. A method of forming integrated circuitry, sequentially comprising:
    forming an inwardly-tapered-sidewall spacer within an opening of a substrate, wherein the opening comprises sidewalls and the substrate comprises an elevationally outermost surface proximate the opening, the sidewalls including straight linear portions which are angled from normal to the elevationally outermost surface; and
    depositing a first layer over the inwardly-tapered-sidewall spacer within the opening, the first layer comprising a portion of an integrated circuit.

13. The method of claim 12 wherein the straight linear portions are angled at least 5 degrees from normal to the elevationally outermost surface.

14. The method of claim 12 wherein the straight linear portions are angled at least 10 degrees from normal to the elevationally outermost surface.

15. The method of claim 12 wherein the straight linear portions are angled at least 15 degrees from normal to the elevationally outermost surface.

16. The method of claim 12 wherein the sidewall spacer comprises laterally inner sidewall portions, the laterally inner sidewall portions including straight linear portions which are angled normal to the elevationally outermost surface.

17. A method of forming integrated circuitry, comprising:
    providing a substrate having a first layer thereon, the first layer having an opening;
    forming a sidewall spacer within the opening, the sidewall spacer being laterally thicker at an elevationally outer portion within the opening as compared to an elevationally inner portion within the opening; and
    forming a second layer within the opening laterally over the sidewall spacer, the second layer comprising an integrated circuitry component.

18. The method of claim 17 wherein the sidewall spacer comprises TiN.

19. The method of claim 17 wherein the forming the sidewall spacer comprises flowing $TiCl_4$ and $NH_3$ to the substrate to form TiN, the $TiCl_4$ and $NH_3$ being flowed at a volumetric ratio of $TiCl_4$ to $NH_3$ of from about 1:1 to about 4:1.

20. The method of claim 17 wherein the removing at least a portion of the sidewall spacer comprises exposing the spacer to a mixture comprising $H_2SO_4$ and $H_2O_2$, the mixture having a weight ratio of $H_2SO_4$ to $H_2O_2$ of about 2:1.

21. The method of claim 20 wherein second layer comprises polysilicon.

22. The method of claim 17 wherein the sidewall spacer comprises polysilicon and the second layer comprises TiN.

23. The method of claim 17 wherein the removing at least a portion of the sidewall spacer comprises exposing the spacer to TMAH.

24. The method of claim 17 wherein the opening comprises sidewalls and the sidewall spacer is formed over at least upper portions of the sidewalls.

25. The method of claim 17 wherein the opening comprises sidewalls and the sidewall spacer is formed over an entirety of the sidewalls.

26. The method of claim 17 wherein the opening comprises sidewalls and the first layer comprises an elevationally outermost surface proximate the opening, the sidewalls including straight linear portions which are angled from normal to the elevationally outermost surface.

27. The method of claim 26 wherein the straight linear portions are angled at least 5 degrees from normal to the elevationally outermost surface.

28. The method of claim 26 wherein the straight linear portions are angled at least 10 degrees from normal to the elevationally outermost surface.

29. The method of claim 26 wherein the straight linear portions are angled at least 15 degrees from normal to the elevationally outermost surface.

30. The method of claim 26 wherein the sidewall spacer comprises laterally inner sidewall portions, the laterally inner sidewall portions including straight linear portions which are angled normal to the elevationally outermost surface.

31. The method of claim 17 wherein the removing comprises removing at least a majority of the sidewall spacer.

32. The method of claim 17 wherein the removing comprises removing substantially all of the sidewall spacer.

* * * * *

UNITED STATES PATENT AND TRADEMARK OFFICE
CERTIFICATE OF CORRECTION

PATENT NO. : 7,482,239 B2 Page 1 of 1
APPLICATION NO. : 11/515432
DATED : January 27, 2009
INVENTOR(S) : Basceri et al.

It is certified that error appears in the above-identified patent and that said Letters Patent is hereby corrected as shown below:

In column 5, line 19, in Claim 4, delete "$H_2\ O_2$," and insert -- $H_2O_2$, --, therefor.

In column 6, line 22, in Claim 19, delete "TIN," and insert -- TiN, --, therefor.

In column 6, line 31, in Claim 22, delete "TIN." and insert -- TiN. --, therefor.

Signed and Sealed this

Twenty-first Day of April, 2009

JOHN DOLL
*Acting Director of the United States Patent and Trademark Office*